(12) United States Patent
Kim et al.

(10) Patent No.: US 12,014,763 B2
(45) Date of Patent: *Jun. 18, 2024

(54) MAGNETIC JUNCTION MEMORY DEVICE AND WRITING METHOD THEREOF

(71) Applicant: Samsung Electronics Co., Ltd., Suwon-si (KR)

(72) Inventors: Chan Kyung Kim, Hwaseong-si (KR); Ji Yean Kim, Hwaseong-si (KR); Hyun Taek Jung, Seoul (KR); Ji Eun Kim, Hwaseong-si (KR); Tae Seong Kim, Yongin-si (KR); Sang-Hoon Jung, Hwaseong-si (KR); Jae Wook Joo, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/882,790

(22) Filed: Aug. 8, 2022

(65) Prior Publication Data

US 2022/0375505 A1    Nov. 24, 2022

Related U.S. Application Data

(63) Continuation of application No. 16/848,140, filed on Apr. 14, 2020, now Pat. No. 11,443,791.

(30) Foreign Application Priority Data

Jul. 22, 2019  (KR) ......................... 10-2019-0088383

(51) Int. Cl.
*G11C 11/16* (2006.01)

(52) U.S. Cl.
CPC ........ *G11C 11/1675* (2013.01); *G11C 11/161* (2013.01); *G11C 11/1655* (2013.01); *G11C 11/1657* (2013.01); *G11C 11/1673* (2013.01)

(58) Field of Classification Search
CPC ............ G11C 11/1673; G11C 11/1657; G11C 11/1655; G11C 11/161; G11C 11/1675
(Continued)

(56) References Cited

U.S. PATENT DOCUMENTS

| 7,616,476 B2 | 11/2009 | Hidaka |
| 7,663,910 B2 | 2/2010 | Kang et al. |

(Continued)

FOREIGN PATENT DOCUMENTS

KR          101224259 B1      1/2013

OTHER PUBLICATIONS

Notice of Allowance dated May 4, 2022 for corresponding U.S. Appl. No. 16/848,140.
(Continued)

*Primary Examiner* — Sung Il Cho
(74) *Attorney, Agent, or Firm* — Harness, Dickey & Pierce, P.L.C.

(57) ABSTRACT

Magnetic junction memory devices and methods for writing data to memory devices are provided. The magnetic junction memory device includes a first memory bank including first magnetic junction memory cells, a first local write driver adjacent to the first memory bank, connected to global data lines, the first local write driver configured to write data to the first magnetic junction memory cells via local data lines, a second memory bank adjacent to the first memory bank and including second magnetic junction memory cells, a second local write driver adjacent to the second memory bank, connected to the global data lines, the second local write driver configured to write data to the second magnetic junction memory cells via local data lines, and a global write driver configured to provide first and second write data to the first and second local write driver, respectively, via the global data lines.

18 Claims, 9 Drawing Sheets

(58) Field of Classification Search
 USPC .......................................................... 365/158
 See application file for complete search history.

(56) References Cited

U.S. PATENT DOCUMENTS

| | | | |
|---|---|---|---|
| 7,843,716 | B2 | 11/2010 | Kang et al. |
| 8,031,508 | B2 | 10/2011 | Toda et al. |
| 8,315,090 | B2 | 11/2012 | Ong |
| 8,385,106 | B2 | 2/2013 | Ong |
| 8,587,994 | B2 | 11/2013 | Kim et al. |
| 9,183,910 | B2 | 11/2015 | Lee et al. |
| 9,202,543 | B2 | 12/2015 | Boujamaa et al. |
| 9,384,828 | B2 | 7/2016 | Oh |
| 9,799,385 | B2 | 10/2017 | Fujita |
| 2011/0299330 | A1 | 12/2011 | Ong |
| 2013/0322162 | A1* | 12/2013 | Lee .................... G11C 11/1675 365/158 |
| 2014/0157065 | A1 | 6/2014 | Ong |
| 2015/0310904 | A1* | 10/2015 | Kim ................... G11C 11/1659 365/158 |
| 2017/0270987 | A1* | 9/2017 | Matsuoka .......... G11C 13/0002 |
| 2017/0345496 | A1 | 11/2017 | Liu et al. |
| 2019/0080740 | A1* | 3/2019 | Takahashi ........ G11C 29/12005 |
| 2020/0057687 | A1 | 2/2020 | Louie et al. |

OTHER PUBLICATIONS

Office Action dated Jan. 24, 2022 for corresponding U.S. Appl. No. 16/848,140.
Office Action dated Sep. 29, 2021 for corresponding U.S. Appl. No. 16/848,140.
Office Action dated Jun. 7, 2021 for corresponding U.S. Appl. No. 16/848,140.

\* cited by examiner

FIG. 5

| | BANK A | | BANK B | | BANK C | | BANK D | | | |
|---|---|---|---|---|---|---|---|---|---|---|
| SMCA4 | LWD4 | SMCA8 | LWD8 | SMCA12 | LWD12 | SMCA16 | LWD16 | SA4 | | |
| | | | | | | | | CD4 GWD4 | | |
| RD | CTRL | RD | CTRL | RD | CTRL | RD | CTRL | GCTRL | | |
| SMCA3 | LWD3 | SMCA7 | LWD7 | SMCA11 | LWD11 | SMCA15 | LWD15 | SA3 | | |
| | | | | | | | | CD3 GWD3 | | |
| RD | CTRL | RD | CTRL | RD | CTRL | RD | CTRL | GCTRL | | |
| SMCA2 | LWD2 | SMCA6 | LWD6 | SMCA10 | LWD10 | SMCA14 | LWD14 | SA2 | | |
| | | | | | | | | CD2 GWD2 | | |
| RD | CTRL | RD | CTRL | RD | CTRL | RD | CTRL | GCTRL | | |
| SMCA1 | LWD1 | SMCA5 | LWD5 | SMCA9 | LWD9 | SMCA13 | LWD13 | SA1 | | |
| | | | | | | | | CD1 GWD1 | | |

MAGNETIC JUNCTION MEMORY DEVICE AND WRITING METHOD THEREOF

This is a continuation of U.S. application Ser. No. 16/848,140, filed Apr. 14, 2020, which claims priority to Korean Patent Application No. 10-2019-0088383, filed on Jul. 22, 2019, and all the benefits accruing therefrom under 35 U.S.C. § 119, the disclosure of which is incorporated herein by reference in its entirety.

BACKGROUND

1. Field

The present disclosure relates to magnetic junction memory devices and writing methods thereof.

2. Description of the Related Art

A random-access memory (RAM) may include a volatile memory and a nonvolatile memory. The volatile memory loses data present therein whenever the supply of power is cut off, and the nonvolatile memory retains its memory even when the supply of power is cut off.

A spin torque transfer-magnetic random-access memory (STT-MRAM), which is a type of nonvolatile memory, records data in accordance with the resistance state of a magnetic tunneling junction (MJT). That is, data can be written to the STT-MRAM by applying a write current to memory cells to change the resistance state of the memory cells. However, during a write operation, it takes time to change the resistance state of the memory cells. Thus, research is needed to reduce the amount of time that it takes to change the resistance state of the memory cells during a write operation.

SUMMARY

Example embodiments of the present disclosure provide magnetic junction memory devices capable of reducing the amount of time that it takes to write data.

Example embodiments of the present disclosure provide writing methods of magnetic junction memory devices capable of reducing the amount of time that it takes to write data.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to embodiments of the present disclosure, there is provided a magnetic junction memory device which comprises a first memory bank including a plurality of first magnetic junction memory cells, a first local write driver adjacent to the first memory bank and connected to first and second global data lines, the first local write driver configured to write data to the plurality of first magnetic junction memory cells via first and second local data lines, a second memory bank adjacent to the first memory bank and including a plurality of second magnetic junction memory cells, a second local write driver disposed adjacent to the second memory bank and connected to the first and second global data lines, the second local write driver configured to write data to the plurality of second magnetic junction memory cells via third and fourth local data lines, the third and fourth local data lines not connected to the first and second local data lines, and a global write driver configured to provide first write data to the first local write driver via the first and second global data lines and provide second write data to the second local write driver via the first and second global data lines.

According to the aforementioned and other embodiments of the present disclosure, there is provided a magnetic junction memory device comprises a first local write driver adjacent to a first sub-memory cell array, which includes a plurality of first magnetic junction memory cells, and the first local write driver configured to write first write data to the plurality of first magnetic junction memory cells via first and second local data lines, and a second local write driver adjacent to a second sub-memory cell array, which includes a plurality of second magnetic junction memory cells, and the second local write driver configured to write second write data to the plurality of second magnetic junction memory cells via third and fourth local data lines, the third and fourth local data lines not connected to the first and second local data lines, wherein the first local write driver includes a first write latch configured to store the first write data to be written to the first magnetic junction memory cells, and the second local write driver includes a second write latch configured to store the second write data to be written to the second magnetic junction memory cells and the second write latch is separate from the first write latch.

According to the aforementioned and other embodiments of the present disclosure, there is provided a magnetic junction memory device comprises a global write driver configured to receive a first write command for a first memory bank, which includes a plurality of first magnetic junction memory cells, during a first write period and receive a second write command for a second memory bank, which includes a plurality of second magnetic junction memory cells, during a second write period, which follows the first write period, a first local write driver configured to receive the first write command from the global write driver and perform a first write operation on the first magnetic junction memory cells during the second write period, and a second local write driver configured to receive the second write command from the global write driver and perform a second write operation on the plurality of second magnetic junction memory cells during a third write period, which follows the second write period, wherein during the third write period, the first local write driver is configured to perform the first write operation on the first magnetic junction memory cells based on the first write command.

According to the aforementioned and other embodiments of the present disclosure, there is provided a writing method of a magnetic junction memory device which is configured to write data to first and second magnetic junction memory cells using a global write driver and first and second local write drivers, the writing method comprises receiving, by the global write driver, a first write command and first write data, writing, by the first local write driver, the first write data to the first magnetic junction memory cell based on the first write command while the global write driver is receiving a second write command and second write data, and writing, by the first local write driver, the first write data to the first magnetic junction memory cell in response to the first write command while the second local write driver is writing the second write data to the second magnetic junction memory cell based on the second write command.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which:

FIG. 5 is a conceptual layout view of a nonvolatile memory device according to some example embodiments of the present disclosure;

DETAILED DESCRIPTION

Embodiments of the present disclosure will hereinafter be described with reference to the accompanying drawings.

Figure 1:
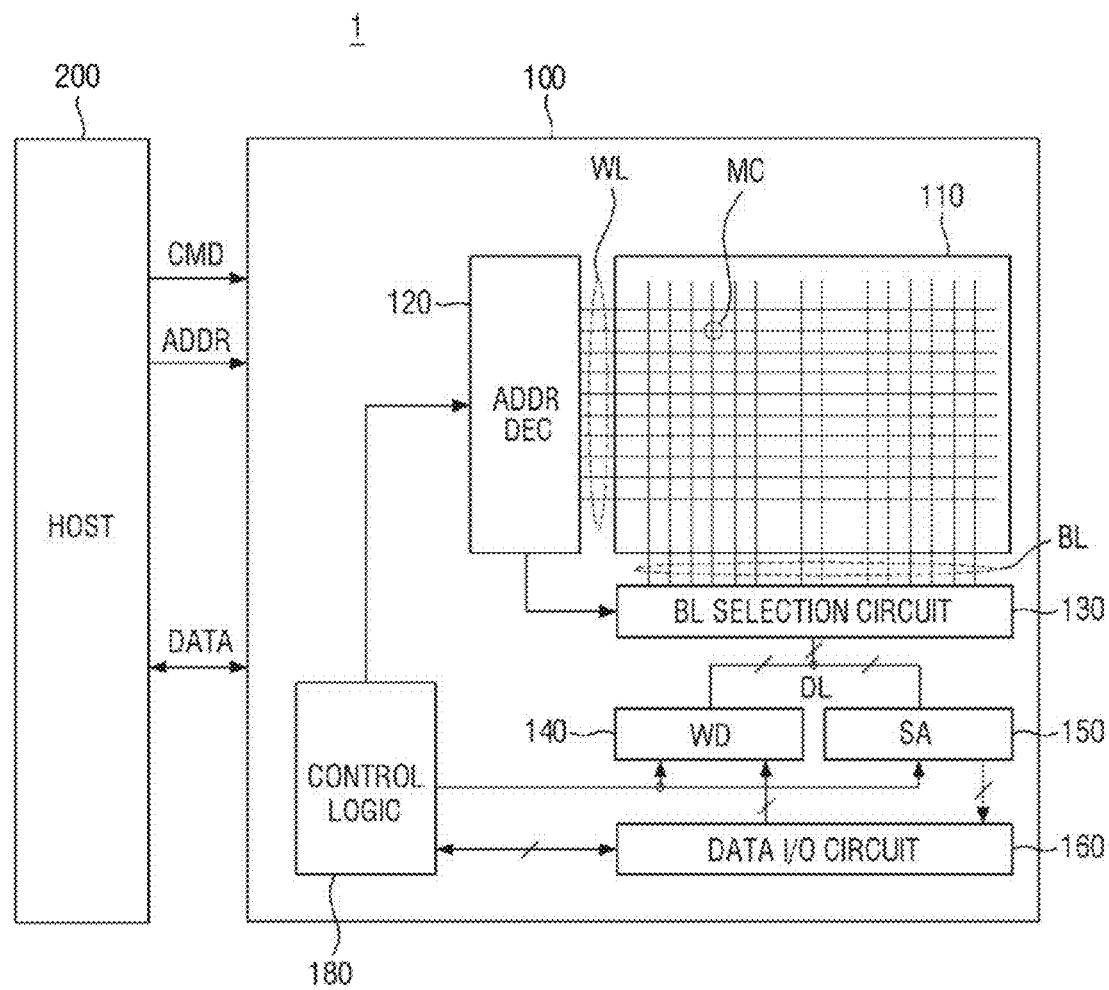
FIG. 1 illustrates a nonvolatile memory device according to some example embodiments of the present disclosure.

FIG. 1 illustrates a nonvolatile memory device according to some example embodiments of the present disclosure.

Referring to FIG. 1, a nonvolatile memory device 100 may read or write data in response to, or based on, a request from a host 200.

For example, the nonvolatile memory device 100 may receive commands CMD and an address DDR from the host 200. The commands CMD may include a read command, a write command, and the like. In some example embodiments, where the host 200 transmits a read command to the nonvolatile memory device 100, the nonvolatile memory device 100 may provide data DATA read from a memory cell array 110 to the host 200.

In some example embodiments, where the host 200 transmits data DATA to be written and a write command to the nonvolatile memory device 100, the nonvolatile memory device 100 may write the data DATA to the memory cell array 110.

The nonvolatile memory device 100 may include the memory cell array 110, an address decoder circuit 120, a bitline selection circuit 130, a write driver circuit 140, a sense amplification circuit 150, a data input/output (I/O) circuit 160, and a control logic 180, but the present disclosure is not limited thereto. That is, some of these elements may not be provided, or new elements may be added.

The address decoder circuit 120 (or other circuitry, for example, the bitline selector circuit 130, the write driver circuit 140, the sense amplifier circuit 150, the data input/output (I/O) circuit 160, the control logic 180, or other circuitry discussed herein) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 110 may include a plurality of nonvolatile memory cells MC for storing data. The memory cells MC may include variable resistance elements whose resistance corresponds to data stored therein, for example, magnetic tunnel junctions (MTJs).

In some example embodiments, the nonvolatile memory device 100 may also be referred to as a resistive random-access memory (RRAM or ReRAM) device. For example, the memory cell array 110 of the nonvolatile memory device 100 may include phase-change random-access memories (PRAMs) or ferroelectric random-access memories (FRAMs), or may include magnetic random-access memories (MRAMs) such as spin transfer torque-magnetic random access memories (STT-MRAMs), spin torque transfer magnetization switching random-access memories (spin-RAMs), or spin momentum transfer-random access memories (SMT-RAMs).

Some example embodiments of the nonvolatile memory device 100 will hereinafter be described as being an MRAM device, but the present disclosure is not limited thereto.

The memory cell array 110 may include one or more memory cells MC to which data can be written. For example, the memory cell array 110 may include memory cells MC which are arranged at locations corresponding to a plurality of wordlines WL and a plurality of bitlines BL. The memory cells MC will be described later in detail.

In some example embodiments, the memory cell array 110 may include one or more sub-memory cell arrays, and each of the sub-memory cell arrays may include a number of memory cells MC. That is, a plurality of sub-memory cell arrays in each of which a number of memory cells MC and wordlines WL and bitlines BL for controlling the memory cells MC are arranged may be gathered to form the memory cell array 110.

In some example embodiments, data DATA may be read or written in units of the sub-memory cell arrays. In some example embodiments, the nonvolatile memory device 100 may write or read data in units of four sub-memory cell arrays (e.g., in units of memory banks), but the present disclosure is not limited thereto.

The address decoder circuit 120 may receive the address ADDR and may decode the address ADDR into row and column addresses. The address decoder circuit 120 may select one of the wordlines WL in accordance with the row address. In some example embodiments, the address decoder circuit 120 may transmit the column address to the bitline selection circuit 130. For example, the address decoder circuit 120 may include a row decoder, a column decoder, an address buffer, and the like.

The bitline selection circuit 130 may be connected to the memory cell array 110 via the bitlines BL and may also be connected to the write driver circuit 140 and the sense amplification circuit 150. The bitline selection circuit 130 may operate under the control of the control logic 180. The bitline selection circuit 130 may be configured to receive a decoded column address from the address decoder circuit 120.

The bitline selection circuit 130 may select one of the bitlines BL using a decoded column address. For example, during a write operation, the bitline BL by the bitline selection circuit 130 may be connected to a data line DL and may thus be connected to the write driver circuit 140. During a read operation, the bitline selection circuit 130 may connect the selected bitline BL to the sense amplification circuit 150.

The write driver circuit 140 may operate under the control of the control logic 180. The write driver circuit 140 may program a memory cell MC connected to the bitline BL selected by the bitline selection circuit 130 and the wordline WL selected by the address decoder circuit 120. The write driver circuit 140 may generate a current or a voltage based on data input thereto from the data I/O circuit 160 and may output the generated current or voltage to the selected bitline BL.

In some example embodiments, the write driver circuit 140 may include a local write driver for writing data to the memory cells MC and a global write driver for providing a write control signal and/or write data to the local write driver.

The sense amplification circuit 150 may operate under the control of the control logic 180. The sense amplification circuit 150 may include a read circuit which detects a memory cell MC connected to the bitline BL selected by the bitline selection circuit 130 and to the wordline WL selected by the address decoder circuit 120.

The read circuit may read data from the detected memory cell MC by detecting a current that flows in the selected bitline BL or a voltage applied to the selected bitline BL. The sense amplification circuit 150 may output the read data to the data I/O circuit 160.

The data I/O circuit 160 may operate under the control of the control logic 180. The data I/O circuit 160 may transmit data input thereto external to the write driver circuit 140 and may output data input thereto from the sense amplification circuit 150 externally.

The control logic 180 may control the general operation of the nonvolatile memory device 100. For example, the control logic 180 may control the address decoder circuit 120, the bitline selection circuit 130, the write driver circuit 140, the sense amplification circuit 150, and the data I/O circuit 160. The control logic 180 may operate in response to commands or control signals input thereto externally.

Figure 2:
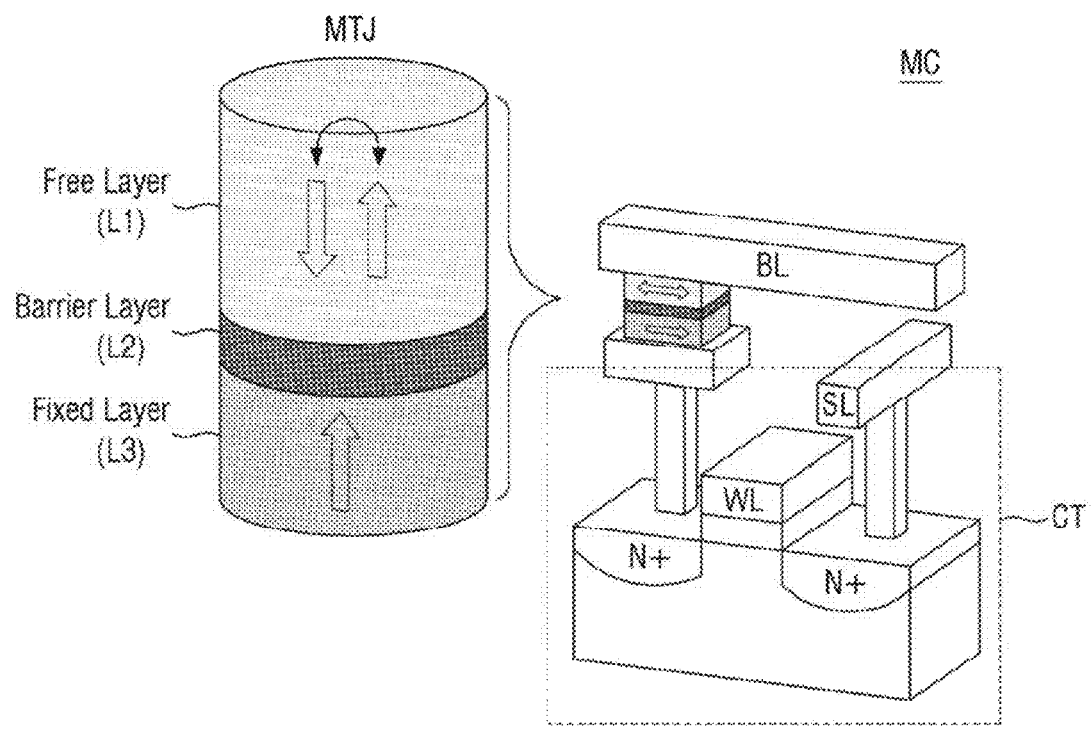
FIG. 2 illustrates a memory cell according to some example embodiments of the present disclosure.
Figure 3:
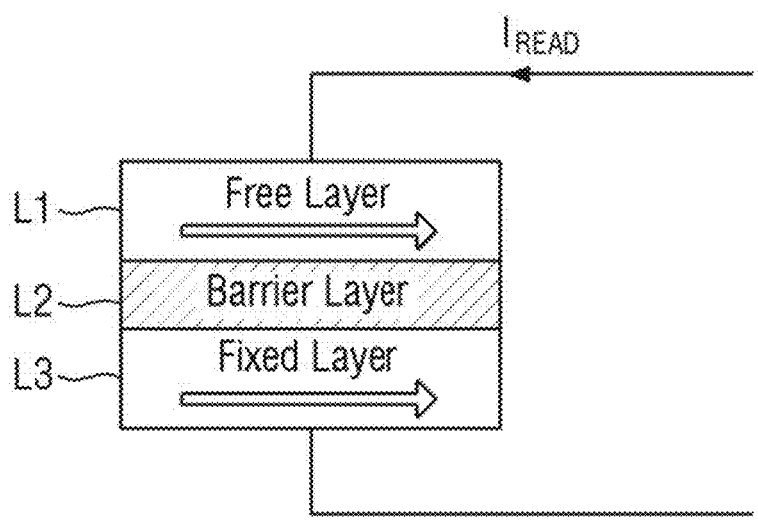
FIGS. 3 and 4 illustrate how to store data in accordance with the magnetization direction of a memory cell.
Figure 4:
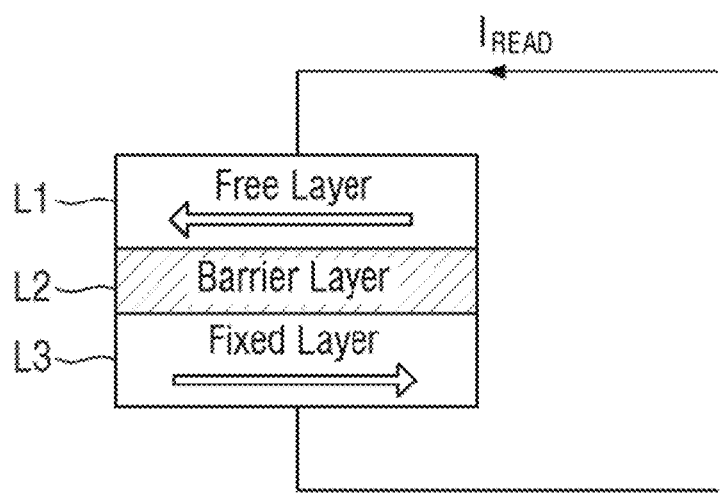

FIG. 2 illustrates a memory cell according to some example embodiments of the present disclosure. FIGS. 3 and 4 illustrate how to store data in accordance with the magnetization direction of a memory cell.

Referring to FIG. 2, a memory cell MC may include a variable resistance element MTJ and a cell transistor CT. The gate of the cell transistor CT may be connected to a wordline WL. A first electrode of the cell transistor CT may be connected to a bitline BL via the variable resistance element MTJ. A second electrode of the cell transistor CT may be connected to a source line SL.

In some example embodiments, the wordline WL and the source line SL may extend in the same direction, but the present disclosure is not limited thereto. In other embodiments, the wordline WL and the source line SL may extend in different directions that form a right angle, but the present disclosure is not limited thereto.

The variable resistance element MTJ may include a free layer L1, a fixed layer L3, and a barrier layer L2 which is disposed between the free layer L1 and the fixed layer L3. The magnetization direction of the fixed layer L3 may be fixed, and the magnetization direction of the free layer L1 may be the same as, or opposite to, the magnetization direction of the fixed layer L3. In order to fix the magnetization direction of the fixed layer L3, the variable resistance element MTJ may further include an antiferromagnetic layer.

In some example embodiments, the free layer L1 may include a material having a variable magnetization direction. The magnetization direction of the free layer L1 may be changed by an electrical/magnetic factor from within or outside the memory cell MC. The free layer L1 may include a ferromagnetic material containing at least one of cobalt (Co), iron (Fe), and/or nickel (Ni). For example, the free layer L1 may include at least one selected from among FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and/or Y3Fe5O12.

The barrier layer L2 may have a thickness smaller than a spin diffusion distance. The barrier layer L2 may include a nonmagnetic material. For example, the barrier layer L2 may be formed of at least one selected from among oxides of magnesium (Mg), titanium (Ti), aluminum (Al), magnesium-zinc (MgZn), and magnesium-boron (MgB) and/or nitrides of titanium (Ti) and/or vanadium (V).

The fixed layer L3 may have a fixed magnetization direction due to the antiferromagnetic layer. The fixed layer L3 may include a ferromagnetic material. For example, the fixed layer L3 may include at least one selected from among CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, and/or Y3Fe5O12.

In some example embodiments, the antiferromagnetic layer may include an antiferromagnetic material. For example, the antiferromagnetic layer may include at least one selected from among PtMn, IrMn, MnO, MnS, MnTe, MnF2, FeCl2, FeO, CoCl2, CoO, NiCl2, NiO, and/or Cr.

When a read operation is being performed on the memory cell MC, a high-level voltage (e.g., a logic-high voltage) may be provided to the wordline WL. Then, the cell transistor CT may be turned on in response to the voltage provided to the wordline WL. Also, in order to measure the resistance of the variable resistance element MTJ, a read current Iread may be provided from the bitline BL in the direction of the source line SL or from the source line SL in the direction of the bitline BL. Data stored in the variable resistance element MTJ may be determined based on the resistance measured from the variable resistance element MTJ.

The resistance of the variable resistance element MTJ may vary depending on the magnetization direction of the free layer L1. In response to the read current Iread being provided to the variable resistance element MTJ, a data voltage is output in accordance with the resistance of the variable resistance element MTJ. Since the intensity of the read current Iread is smaller than the intensity of a write current, the magnetization direction of the free layer L1 is not changed by the read current Iread.

Referring to FIG. 3, in some example embodiments, the magnetization direction of the free layer L1 and the magnetization direction of the fixed layer L3 may be parallel (p) to each other. In some example embodiments, the variable resistance element MTJ may have a low resistance Rp, and the data stored in the variable resistance element 1 may be determined as being, for example, "0".

Referring to FIG. 4, in some example embodiments, the magnetization direction of the free layer L1 and the magnetization direction of the fixed layer L3 may be anti-parallel (ap) to each other. In some example embodiments, the variable resistance element MTJ may have a high resistance Rap, and the data stored in the variable resistance element 1 may be determined as being, for example, "1".

FIG. 2 illustrates the free layer L1 and the fixed layer L3 of the variable resistance element MTJ as being horizontal magnetic elements, but the present disclosure is not limited thereto. Alternatively, the free layer L1 and the fixed layer L3 of the variable resistance element MTJ may be provided as vertical magnetic elements.

Figure 6:
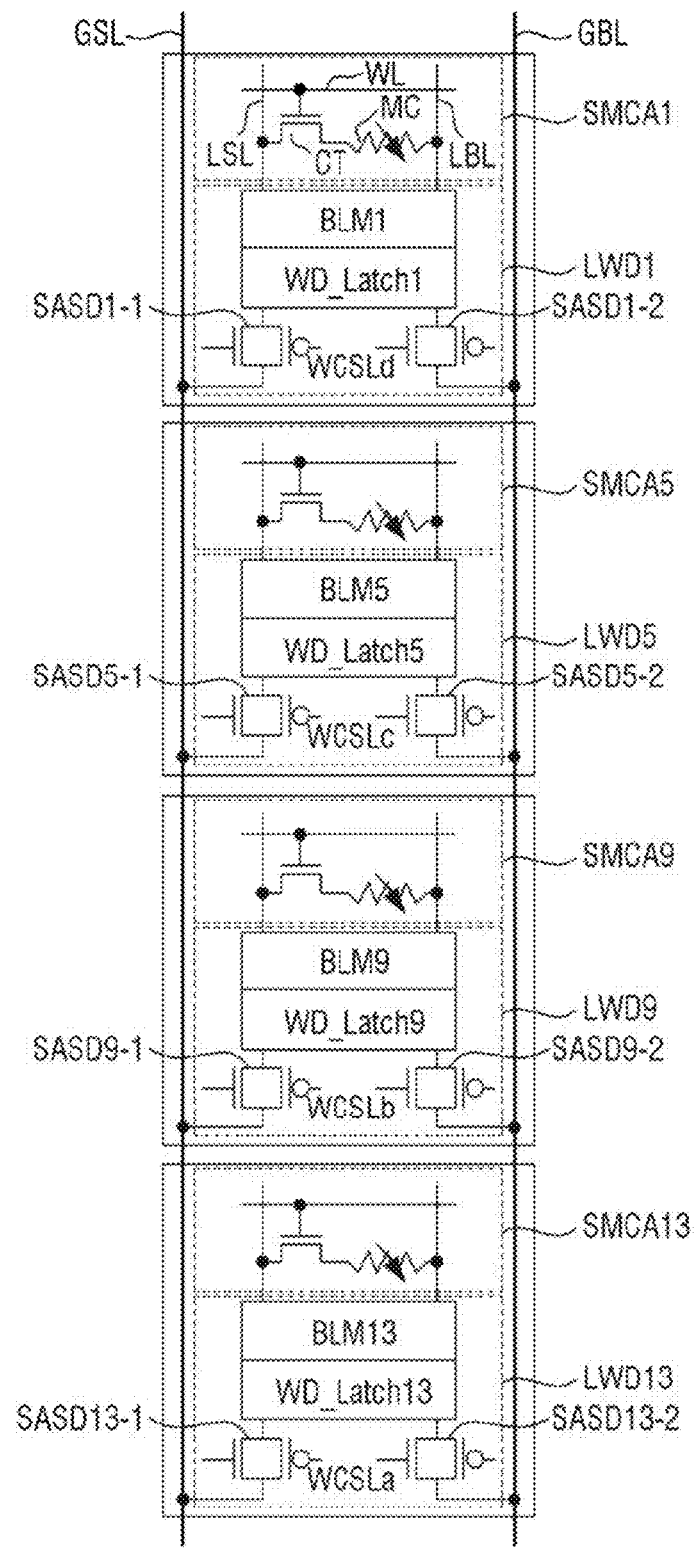
FIG. 6 is a circuit diagram of a sub-memory cell array illustrated in FIG. 5.

FIG. 5 is a conceptual layout view of a nonvolatile memory device according to some example embodiments of the present disclosure. FIG. 6 is a circuit diagram of a sub-memory cell array illustrated in FIG. 5.

Referring to FIGS. 5 and 6, a nonvolatile memory device 100 may include a plurality of sub-memory cell arrays SMCA1 through SMCA16. The sub-memory cell arrays SMCA1 through SMCA16 may form the memory cell array 110 of FIG. 1. In other words, the memory cell array 110 of FIG. 1 may be divided into the sub-memory cell arrays SMCA1 through SMCA16. The nonvolatile memory device 100 is illustrated as including 16 sub-memory cell arrays SMCA1 through SMCA16, but the present disclosure is not limited thereto. The number of sub-memory cell arrays that form the memory cell array 110 of FIG. 1 may vary.

Referring to FIG. 6, each of the sub-memory cell arrays SMCA1 through SMCA16 may include a plurality of memory cells MC. FIG. 6 illustrates only some of the elements of the nonvolatile memory device 100 of FIG. 5, e.g., the sub-memory cell arrays SMCA1, SMCA5, SMCA9, and SMCA13 that are arranged in the same column, but obviously, descriptions of the sub-memory cell arrays SMCA1, SMCA5, SMCA9, and SMCA13 may be directly applicable to the other sub-memory cell arrays. For convenience, FIG. 6 illustrates that the sub-memory cell array SMCA1 includes only one memory cell MC, but the number of memory cells MC included in the sub-memory cell array SMCA1 is not particularly limited.

A plurality of memory cells MC may be connected to a plurality of cell transistors CT. The gates of the cell transistors CT may be connected to wordlines WL, and first ends of cell transistors CT that are not connected to the memory cells MC may be connected to source lines SL. The memory cells MC may be connected to bitlines BL.

In some example embodiments, the source lines SL and the bitlines BL may be connected to a write assist circuit (not illustrated) which is for use in a write operation.

Referring again to FIG. 5, row decoders RD which select wordlines WL disposed in the sub-memory cell arrays SMCA1 through SMCA16 may be disposed on first sides of the sub-memory cell arrays SMCA1 through SMCA16.

Local write drivers LWD1 through LWD16, which are for writing data to memory cells MC included in the sub-memory cell arrays SMCA1 through SMCA16, respectively, may be disposed on second sides of the sub-memory cell arrays SMCA1 through SMCA16, respectively. That is, independent write drivers may be allocated to the sub-memory cell arrays SMCA1 through SMCA16.

Referring to FIG. 6, the local write driver WD1 may include a bitline multiplexer BLM1, a write latch WD_Latch1, and sub-memory cell array selection elements SASD1-1 and SASD1-2. As already described above, a description of the local write driver WD1 may be directly applicable to the other local write drivers.

The bitline multiplexer BLM1 may select a local source line LSL and a local bitline LBL of the sub-memory cell array SMCA1 under the control of a control signal. That is, the bitline multiplexer BLM1 may select a local source line LSL and a local bitline LBL connected to a target memory cell MC to which to write data and may thus allow data to be written to the target memory cell MC. Also, the bitline multiplexer BLM1 may select a local source line LSL and a local bitline LBL connected to a target memory cell MC from which to read data and may allow data to be read from the target memory cell MC.

The write latch WD_Latch1 may perform a write operation on the memory cell MC included in the sub-memory cell array SMCA1. For example, the write latch WD_Latch1 may receive data to be written to the memory cell MC included in the sub-memory cell array SMCA1 from a global write driver GWD1 of FIG. 5 and may store the received data. Then, the write latch WD_Latch1 may write the stored data to the memory cell MC included in the sub-memory cell array SMCA1 in response to a control signal. In some example embodiments, the write latch WD_Latch1 may include a control block for performing a write operation on the memory cell MC included in the sub-memory cell array SMCA1.

The sub-memory cell array selection element SASD1-1 may connect a global source line GSL and the local source line LSL of the sub-memory cell array SMCA1 in response to a bank selection control signal WCSLd. The sub-memory cell array selection element SASD1-2 may connect a global bitline GBL and the local bitline LBL of the sub-memory cell array SMCA1 in response to the bank selection control signal WCSLd.

Bank selection control signals WCSLa through WCSLd may be sequentially activated. For example, the bank selection control signal WCLSd may be activated at a first point of time, the bank selection control signal WCSLc may be activated at a second point of time, which is later than the first point of time, the bank selection control signal WCLSb may be activated at a third point of time, which is later than the second point of time, and the bank selection control signal WCLSa may be activated at a fourth point of time, which is later than the third point of time. Alternatively, the bank selection control signals WCLSa through WCLSd may be activated in reverse order to that set forth herein.

Referring again to FIG. 5, local control blocks CTRL may control various operations performed on the sub-memory cell arrays SMCA1 through SMCA16. That is, the local control blocks CTRL may generate control signals for controlling the various operations performed on the sub-memory cell arrays SMCA1 through SMCA16.

Column decoders CD1 through CD4, global write drivers GWD1 through GWD4, sensing circuits SA1 through SA4, and global control blocks GCTRL may be disposed on the outside of the sub-memory cell arrays SMCA1 through SMCA16. The column decoders CD1 through CD4, the global write drivers GWD1 through GWD4, the sensing circuits SA1 through SA4, and the global control blocks GCTRL are illustrated as being disposed below the sub-memory cell arrays SMCA1 through SMCA16, but the present disclosure is not limited thereto.

The sub-memory cell arrays SMCA1 through SMCA16, which are arranged in the same row, may form memory banks BANK A through BANK D. For example, the memory bank BANK A may include four sub-memory cell arrays, e.g., the sub-memory cell arrays SMCA1 through SMCA4, the memory bank BANK B may include four sub-memory cell arrays, e.g., the sub-memory cell arrays SMCA5 through SMCA8, the memory bank BANK C may include four sub-memory cell arrays, e.g., the sub-memory cell arrays SMCA9 through SMCA12, and the memory bank BANK D may include four sub-memory cell arrays, e.g., the sub-memory cell arrays SMCA13 through SMCA16.

In response to a write command being received from the host 200 of FIG. 1, the nonvolatile memory device 100 may perform a write operation in units of the memory banks BANK A through BANK D. For example, in order to write first, second, third, and fourth data, the nonvolatile memory device 100 may write the first data to the memory cell MC included in the sub-memory cell array SMCA1 of the memory bank BANK A in a first write period, may write the second data to the memory cell MC included in the sub-memory cell array SMCA5 of the memory bank BANK B in a second write period, may write the third data to the memory cell MC included in the sub-memory cell array SMCA9 of the memory bank BANK C in a third write period, and may write the fourth data to the memory cell MC included in the sub-memory cell array SMCA13 of the memory bank BANK D in a fourth write period.

The global write driver GWD1 may control a write operation performed by the nonvolatile memory device 100. For example, the global write driver GWD1 may provide the first data to the write latch WD_Latch1 of the local write driver LWD1 and may thus allow the local write driver LWD1 to write the first data to the memory cell MC included in the sub-memory cell array SMCA1 in the first write period, may provide the second data to the write latch WD_Latch5 of the local write driver LWD5 and may thus allow the local write driver LWD5 to write the second data to the memory cell MC included in the sub-memory cell array SMCA5 in the second write period, may provide the third data to the write latch WD_Latch9 of the local write driver LWD9 and may thus allow the local write driver LWD9 to write the third data to the memory cell MC included in the sub-memory cell array SMCA9 in the third write period, and may provide the fourth data to the write latch WD_Latch13 of the local write driver LWD13 and may thus allow the local write driver LWD13 to write the second data to the memory cell MC included in the sub-memory cell array SMCA13 in the fourth write period.

The global write driver GWD1 may sequentially provide the first, second, third, and fourth data to the write latches WD_Latch1, WD_Latch5, WD_Latch9, and WD_Latch1, respectively, via the global source line GSL or the global bitline GBL. The local write drivers LWD1, LWD5, LWD9, and LWD13 may write the first, second, third, and fourth data to the memory cells MC included in the sub-memory cell arrays SMCA1, SMCA5, SMCA9, and SMCA9 via the local source lines LSL and the local bitlines LBL of the sub-memory cell arrays SMCA1, SMCA5, SMCA9, and SMCA9.

Sub-memory cell array selection elements SASD1-1, SASD5-1, SASD9-1, and SASD13-1 may connect the global source line GSL and the local source lines LSL of the sub-memory cell arrays SMCA1, SMCA5, SMCA9, and SMCA13 in response to the bank selection control signals WCLSa, WCLSb, WCLSc, and WCLSd, and sub-memory cell array selection elements SASD1-2, SASD5-2, SASD9-2, and SASD13-2 may connect the global bitline GBL and the local bitlines LBL of the sub-memory cell arrays SMCA1, SMCA5, SMCA9, and SMCA13 in response to the bank selection control signals WCLSa, WCLSb, WCLSc, and WCLSd.

The sensing circuits SA1 through SA4 may be connected to memory cells MC via, for example, the global source line GSL. That is, the sensing circuit SA1 may read data from the memory cells MC included in the sub-memory cell arrays SMCA1, SMCA5, SMCA9, and SMCA13, the sensing circuit SA2 may read data from the memory cells MC included in the sub-memory cell arrays SMCA2, SMCA6, SMCA10, and SMCA14, the sensing circuit SA3 may read data from the memory cells MC included in the sub-memory cell arrays SMCA3, SMCA7, SMCA11, and SMCA15, and the sensing circuit SA4 may read data from the memory cells MC included in the sub-memory cell arrays SMCA4, SMCA8, SMCA12, and SMCA16. The sensing circuits SA1 through SA4 will be described later in detail.

The global control blocks GCTRL may control various operations performed by the column decoders CD1 through CD4, the global write drivers GWD1 through GWD4, and the sensing circuits SA1 through SA4. That is, the global control blocks GCTRL may generate control signals for controlling the various operations performed by the column decoders CD1 through CD4, the global write drivers GWD1 through GWD4, and the sensing circuits SA1 through SA4.

In some example embodiments, circuits for generating control signals and reference resistance signals that may be necessary for read operations of the sensing circuits SA1 through SA4 may be disposed in the global control blocks GCTRL.

A write operation of a nonvolatile memory device according to some example embodiments of the present disclosure will hereinafter be described with reference to FIGS. 5 through 9.

Figure 7:
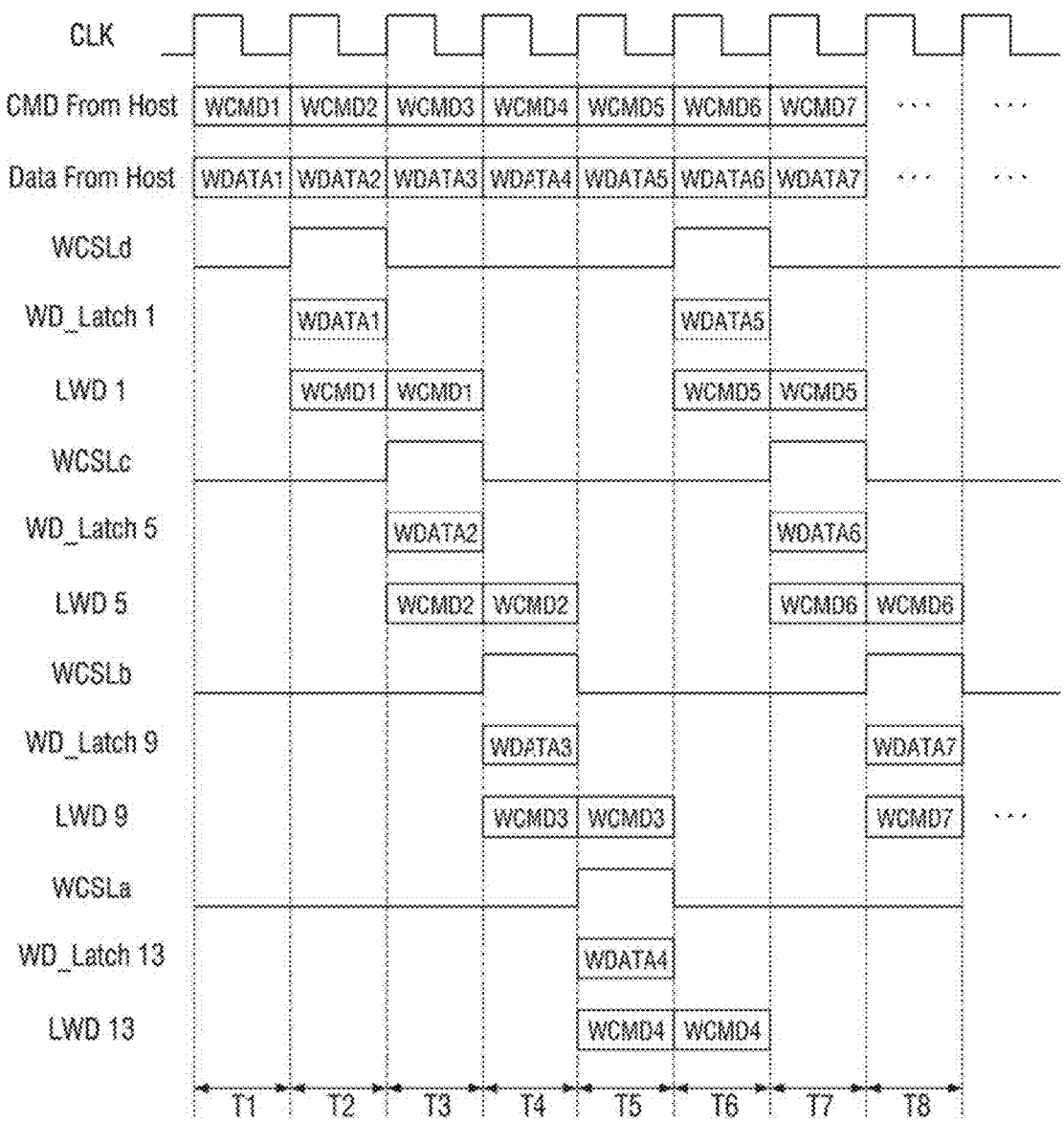
FIGS. 7 through 9 are timing diagrams illustrating a write operation of a nonvolatile memory device according to some example embodiments of the present disclosure.
Figure 8:
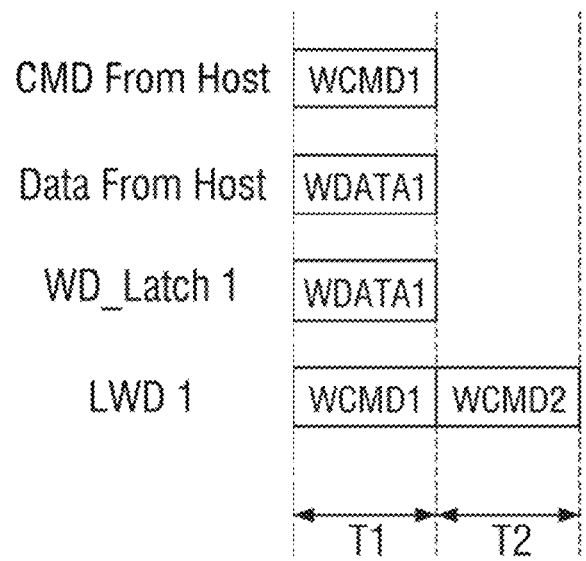
Figure 9:
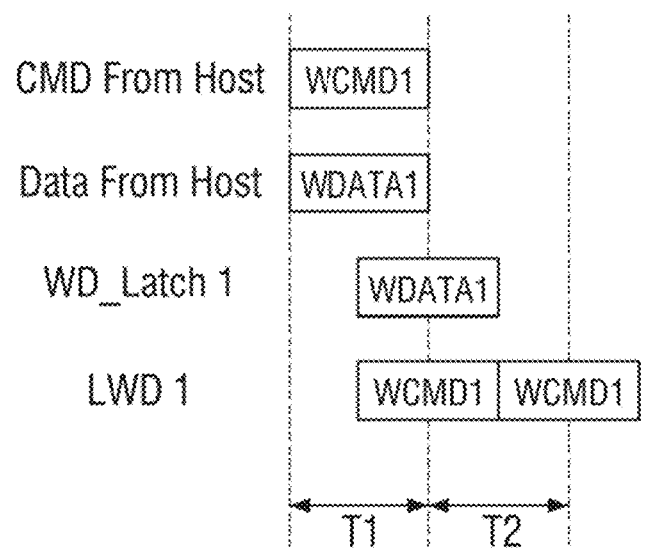

FIGS. 7 through 9 are timing diagrams illustrating a write operation of a nonvolatile memory device according to some example embodiments of the present disclosure.

Referring to FIGS. 5 through 7, during a first write period T1, a first write command WCMD1 and first write data WDATA1 may be received from the host 200 of FIG. 1. For example, the global write driver GWD1 may receive the first write command WCMD1 and the first write data WDATA1 from the host 200 of FIG. 1.

Thereafter, during a second write period T2, a second write command WCMD2 and second write data WDATA2 may be received from the host 200 of FIG. 1. For example, the global write driver GWD1 may receive the second write command WCMD2 and the second write data WDATA2 from the host 200 of FIG. 1.

During the second write period T2, the bank selection control signal WCLSd may be activated. Accordingly, the global source line GSL and the local source line LSL of the sub-memory cell array SMCA1 may be connected, and the global bitline GBL and the local bitline LBL of the sub-memory cell array SMCA1 may be connected. As a result, the global write driver GWD1 can provide the first write command WCMD1 and the first write data WDATA1, received from the host 200 of FIG. 1 during the first write period T1, to the local write driver LWD1.

The first write data WDATA1, which is provided by the global write driver GWD1, may be stored in the data latch WD_Latch1. The local write driver LWD1 may write the first write data WDATA1 to the memory cell MC included in the sub-memory cell array SMCA1. In some example embodiments, the local write driver LWD1 may write the first write data WDATA1 to the memory cell MC included in the sub-memory cell array SMCA1 by applying a write current to the local source line LSL and the local bitline LBL connected to the memory cell MC included in the sub-memory cell array SMCA1, but the present disclosure is not limited thereto.

For convenience, FIG. 7 illustrates that the global write driver GWD1 receives the first write command WCMD1 and the first write data WDATA1 from the host 200 of FIG. 1 during the first write period T1 and provides the first write command WCMD1 and the first write data WDATA1 to the local write driver LWD1 during the second write period T2, but the present disclosure is not limited thereto.

In some example embodiments, referring to FIG. 8, during the first write period T1, the global write driver GWD1 may receive the first write command WCMD1 and the first write data WDATA1, and at the same time, may provide the first write command WCMD1 and the first write data WDATA1 to the local write driver LWD1.

In some example embodiments, referring to FIG. 9, in the first write period T1, the global write driver GWD1 may receive the first write command WCMD1 and the first write data WDATA1, and may begin to provide the first write command WCMD1 and the first write data WDATA1 to the local write driver LWD1 before the first write period T1 ends, the global write driver GWD1. In some example embodiments, the reception of the first write command WCMD1 and the first write data WDATA1 by the global write driver GWD1 and the provision of the first write command WCMD1 and the first write data WDATA1 to the local write driver LWD1 by the global write driver GWD1 may partially overlap with each other.

That is, the first and second write periods T1 and T2 and third through eighth write periods T3 through T8 of FIG. 7 represent some example embodiments, and the present disclosure is not limited thereto.

Referring again to FIGS. 5 through 7, during the third write period T3, a third write command WCMD3 and third write data WDATA3 may be received from the host 200 of FIG. 1. For example, the global write driver GWD1 may receive the third write command WCMD3 and the third write data WDATA3 from the host 200 of FIG. 1.

During the third write period T3, the bank selection control signal WCLSc may be activated. Accordingly, the global source line GSL and the local source line LSL of the sub-memory cell array SMCA5 may be connected, and the global bitline GBL and the local bitline LBL of the sub-memory cell array SMCA5 may be connected. As a result, the global write driver GWD1 can provide the second write command WCMD2 and the second write data WDATA2, received from the host 200 of FIG. 1 during the second write period T2, to the local write driver LWD5.

The second write data WDATA2, which is provided by the global write driver GWD1, may be stored in the data latch WD_Latch5. The local write driver LWD5 may write the second write data WDATA2 to the memory cell MC included in the sub-memory cell array SMCA5. In some example embodiments, the local write driver LWD5 may write the second write data WDATA2 to the memory cell MC included in the sub-memory cell array SMCA5 by applying a write current to the local source line LSL and the local bitline LBL connected to the memory cell MC included in the sub-memory cell array SMCA5, but the present disclosure is not limited thereto.

During the third write period T3, the local write driver LWD1 may write the first write data WDATA1 to the memory cell MC included in the sub-memory cell array SMCA1. That is, while the local write driver LWD5 is writing the second write data WDATA2 to the memory cell MC included in the sub-memory cell array SMCA5, the local write driver LWD1 may repeatedly write the first write data WDATA1 to the memory cell MC included in the sub-memory cell array SMCA1. This type of repeated write operation may be performed because the memory cell MC included in the sub-memory cell array SMCA1 includes a magnetic junction element.

During the fourth write period T4, a fourth write command WCMD4 and fourth write data WDATA4 may be received from the host 200 of FIG. 1. For example, the global write driver GWD1 may receive the fourth write command WCMD4 and the fourth write data WDATA4 from the host 200 of FIG. 1.

During the fourth write period T4, the bank selection control signal WCLSb may be activated. Accordingly, the global source line GSL and the local source line LSL of the sub-memory cell array SMCA9 may be connected, and the global bitline GBL and the local bitline LBL of the sub-memory cell array SMCA9 may be connected. As a result, the global write driver GWD1 can provide the third write command WCMD3 and the third write data WDATA3, received from the host 200 of FIG. 1 during the third write period T3, to the local write driver LWD9.

The third write data WDATA3, which is provided by the global write driver GWD1, may be stored in the data latch WD_Latch9. The local write driver LWD9 may write the third write data WDATA3 to the memory cell MC included in the sub-memory cell array SMCA9. In some example embodiments, the local write driver LWD9 may write the third write data WDATA3 to the memory cell MC included in the sub-memory cell array SMCA9 by applying a write current to the local source line LSL and the local bitline LBL connected to the memory cell MC included in the sub-memory cell array SMCA9, but the present disclosure is not limited thereto.

During the fourth write period T4, the local write driver LWD5 may write the second write data WDATA2 to the memory cell MC included in the sub-memory cell array SMCA5. That is, while the local write driver LWD9 is writing the third write data WDATA3 to the memory cell MC included in the sub-memory cell array SMCA9, the local write driver LWD5 may repeatedly write the second write data WDATA2 to the memory cell MC included in the sub-memory cell array SMCA5. This type of repeated write operation may be performed because the memory cell MC included in the sub-memory cell array SMCA5 includes a magnetic junction element.

Although not specifically illustrated, during the fourth write period T4, the local write driver LWD1 may continue to write the first write data WDATA1 to the memory cell MC included in the sub-memory cell array SMCA1, as necessary.

During the fifth write period T5, a fifth write command WCMD5 and fifth write data WDATA5 may be received from the host 200 of FIG. 1. For example, the global write driver GWD1 may receive the fifth write command WCMD5 and the fifth write data WDATA5 from the host 200 of FIG. 1.

During the fifth write period T5, the bank selection control signal WCLSa may be activated. Accordingly, the global source line GSL and the local source line LSL of the sub-memory cell array SMCA13 may be connected, and the global bitline GBL and the local bitline LBL of the sub-memory cell array SMCA13 may be connected. As a result, the global write driver GWD1 can provide the fourth write command WCMD4 and the fourth write data WDATA4, received from the host 200 of FIG. 1 during the fourth write period T4, to the local write driver LWD13.

The fourth write data WDATA4, which is provided by the global write driver GWD1, may be stored in the data latch WD_Latch13. The local write driver LWD13 may write the fourth write data WDATA4 to the memory cell MC included in the sub-memory cell array SMCA13. In some example embodiments, the local write driver LWD13 may write the fourth write data WDATA4 to the memory cell MC included in the sub-memory cell array SMCA13 by applying a write current to the local source line LSL and the local bitline LBL connected to the memory cell MC included in the sub-memory cell array SMCA13, but the present disclosure is not limited thereto.

During the fifth write period T5, the local write driver LWD9 may write the third write data WDATA3 to the memory cell MC included in the sub-memory cell array SMCA9. That is, while the local write driver LWD13 is writing the fourth write data WDATA4 to the memory cell MC included in the sub-memory cell array SMCA13, the local write driver LWD9 may repeatedly write the third write data WDATA3 to the memory cell MC included in the sub-memory cell array SMCA9. This type of repeated write operation may be performed because the memory cell MC included in the sub-memory cell array SMCA9 includes a magnetic junction element.

Although not specifically illustrated, during the fifth write period T5, the local write driver LWD1 or LWD5 may continue to write the first or second write data WDATA1 or WDATA2 to the memory cell MC included in the sub-memory cell array SMCA1 or SMCA5, as necessary.

During the sixth write period T6, the global write driver GWD1 may receive a sixth write command WCMD6 and sixth write data WDATA6 from the host 200 of FIG. 1.

During the sixth write period T6, the bank selection control signal WCLSa may be activated again. Accordingly, the global write driver GWD1 can provide the fifth write command WCMD5 and the fifth write data WDATA5, received from the host 200 of FIG. 1 during the fifth write period T5, to the local write driver LWD1. In this manner, a write operation can be performed.

In short, referring to FIG. 7, since memory cells include magnetic junction elements, repeated write processes are may be used to write data to the memory cells, but the host 200 of FIG. 1 still can provide a new write command and new write data to a nonvolatile memory device in each write period. Also, the nonvolatile memory device can continue to perform a write operation on the memory cells without any delays, or fewer delays that may be caused by repeated write processes. Therefore, the amount of time that it takes to write data can be considerably reduced.

A sensing circuit of FIG. 5 will hereinafter be described with reference to FIGS. 10 and 11.

Figure 10:
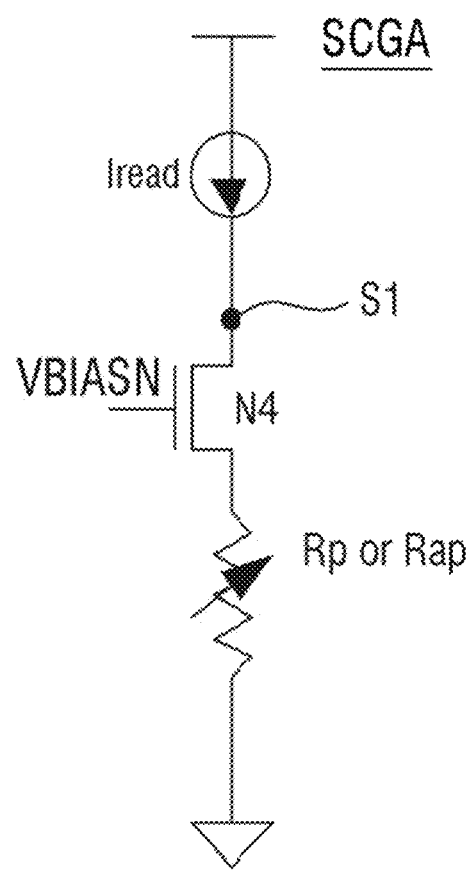
FIGS. 10 and 11 are circuit diagrams of a sensing circuit illustrated in FIG. 5.
Figure 11:
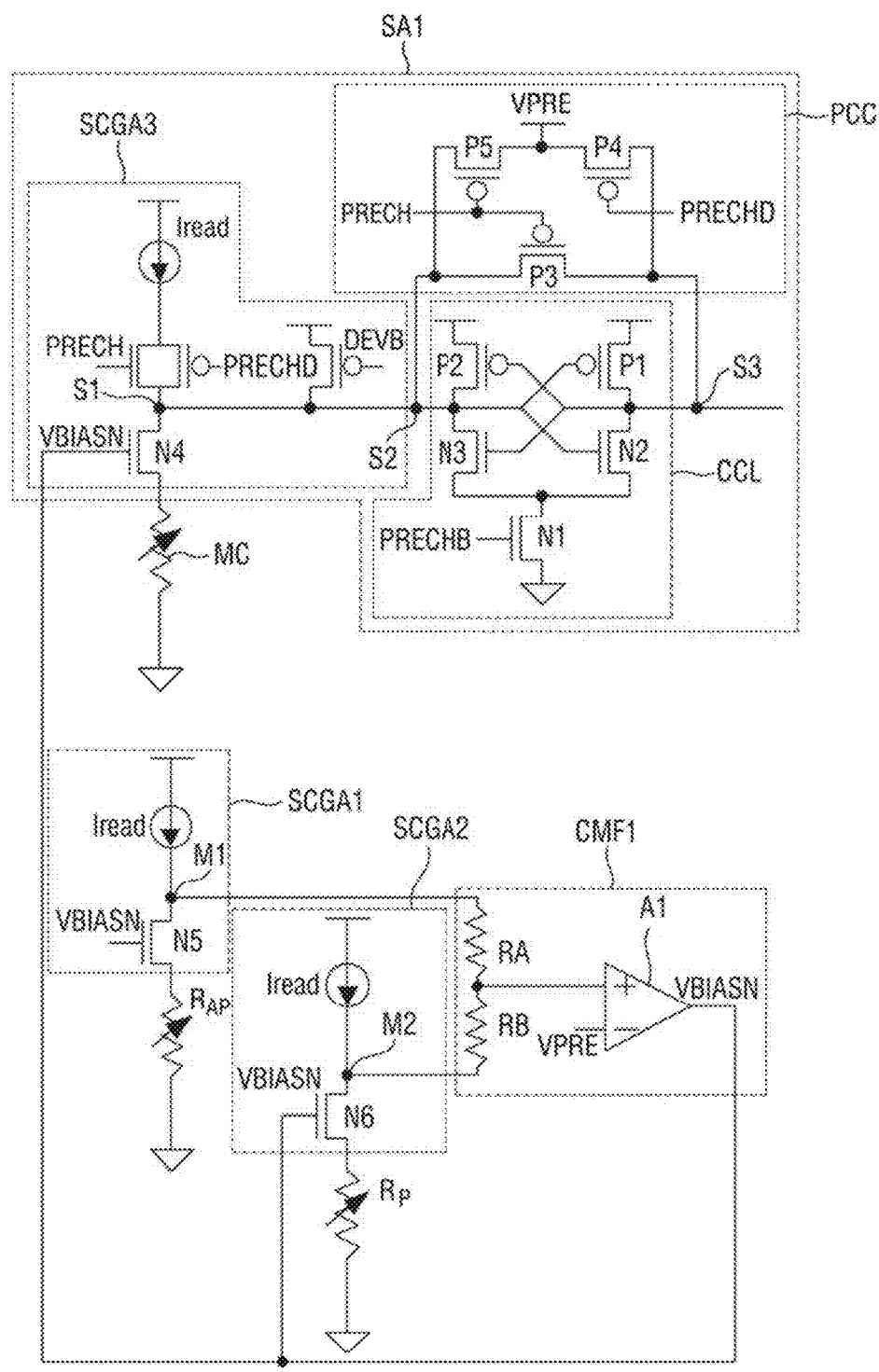

FIGS. 10 and 11 are circuit diagrams of a sensing circuit illustrated in FIG. 5. For example, FIG. 10 is a circuit diagram illustrating the operation of a single-transistor common-gate amplification circuit, and FIG. 11 is a circuit diagram of a sensing circuit using a single-transistor common gate amplification circuit of FIG. 10.

Referring to FIG. 10, a single-transistor common-gate amplification circuit SCGA may include a transistor N4. The transistor N4 may be gated by a gating voltage VBIASN to flow a read current Iread, which is provided by a constant current source at one end of the single-transistor common-gate amplification circuit SCGA, to a resistor at the other end of the single-transistor common-gate amplification circuit SCGA. If the resistor has a low resistance (e.g., a first resistance Rp), the gate-source voltage (Vgs) of the transistor N4 increases when the read current Iread flows into the transistor N4, and as a result, the voltage of a sensing node S1 decreases. When the resistor has a high resistance (e.g., a second resistance Rap), the gate-source voltage (Vgs) of the transistor N4 decreases when the read current Iread flows into the transistor N4, and as a result, the voltage of the sensing node S1 increases. That is, the resistance of the resistor can be identified based on the voltage of the sensing node S1. In other words, data programmed into a magnetic junction memory cell can be read.

By using the single-transistor common-gate amplification circuit SCGA, data can be read from a magnetic junction memory cell. This will hereinafter be described in further detail with reference to FIG. 11.

Referring to FIG. 11, a transistor N5 of a first single-transistor common-gate amplification circuit SCGA1 may be gated by a gating voltage VBIASN to flow a read current Iread, which is provided by a constant current source at one end of the first single-transistor common-gate amplification circuit SCGA1, to a resistor at the other end of the first single-transistor common-gate amplification circuit SCGA1. Since the other end of the first single-transistor common-gate amplification circuit SCGA1 is connected to a reference memory cell having a second resistance RAP, the read current Iread flows into the reference memory cell having the second resistance RAP.

A transistor N6 of a second single-transistor common-gate amplification circuit SCGA2 may be gated by the gating voltage VBIASN to flow the read current Iread, which is provided by a constant current source at one end of the second single-transistor common-gate amplification circuit SCGA2, to a resistor at the other end of the second single-transistor common-gate amplification circuit SCGA2. Since the other end of the second single-transistor common-gate amplification circuit SCGA2 is connected to a reference memory cell having a first resistance RP, the read current Iread flows into the reference memory cell having the first resistance RP.

Since the second resistance RAP is higher than the first resistance RP, the voltage of a sensing node M1 may become higher than the voltage of a sensing node M2.

A common mode feedback amplification circuit CMF1 may include a voltage divider circuit which includes first and second voltage divider resistors RA and RB and an amplifier A1 which has first and second input terminals.

The difference between the voltage of the sensing node M1 and the voltage of the sensing node M2 may be provided to the first input terminal of the amplifier A1 through the voltage divider circuit. Here, the voltage provided to the first input terminal of the amplifier A1 may vary depending on the resistances of the first and second divider resistors RA and RB. A reference voltage VPRE may be provided to the second input terminal of the amplifier A1. The reference voltage VPRE may be used to read data stored in a memory cell MC.

The gating voltage VBIASN, which is the output of the amplifier A1, may be fed back to the gates of the transistors N5 and N6, and the above-described processes are repeated. As this feedback loop is continued, the gating voltage VBIASN, which is to be used in the sensing circuit SA1, is determined. That is, the gating voltage VBIASN is adjusted so that the read current Iread of the sensing circuit SA1 can be set between the first and second resistances Rp and Rap of the memory cell MC. That is, the gating voltage VBIASN is determined by reflecting the distributions of the first and second resistances Rp and Rap of a reference memory cell. Accordingly, reliable sensing margins can be secured when reading data from the memory cell MC using the reference voltage VPRE.

The sensing circuit SA1 may include a third single-transistor common-gate amplification circuit SCGA3, a precharge circuit PCC, and a cross-coupled latch CCL.

A transistor N4 of the third single-transistor common-gate amplification circuit SCGA3 may be gated by the gating voltage VBIASN, which is output from a common-mode feedback amplification circuit CMF1, to flow the read current Iread, which is provided by a constant current source at one end of the third single-transistor common-gate amplification circuit SCGA3, to a sub-memory cell array (e.g., the sub-memory cell array SMCA1 of FIGS. 5 and 6) at the other end of the third single-transistor common-gate amplification circuit SCGA3. The global source line GSL and the local source lines LSL of FIG. 6 may be used to flow the read current Iread to the memory cell MC included in the sub-memory cell array SMCA1.

The voltage of the sensing node S1 may vary depending on the data stored in the memory cell MC. For example, in some example embodiments, where the memory cell MC has the first resistance RP, the voltage of the sensing node S1 may decrease, and in some example embodiments, where the memory cell MC has the second resistance RAP, the voltage of the sensing node S1 may increase.

The precharge circuit PCC may precharge first and second output nodes S2 and S3 to the reference voltage VPRE. To this end, the precharge circuit PCC may include transistors P3 and P5 which are gated by a first precharge signal PRECH and a transistor P4 which is gated by a second precharge signal PRECHD.

The cross-coupled latch CCL may develop the voltages of the first and second output nodes S2 and S3 in accordance with the voltage of the sensing node S1 and may latch the data stored in the memory cell MC based on the developed voltages. The cross-coupled latch CCL may include a transistor P1 which is gated by the voltage of the first output node to pull up the second output node S3, a transistor N2 which is gated by the voltage of the first output node S2 to pull down the second output node S3, a transistor P2 which is gated by the voltage of the second output node S3 to pull up the first output node S2, a transistor N3 which is gated by the voltage of the second output node S3 to pull down the first output node S2, and a transistor N1 which is gated by a third precharge signal PRECHB to connect the ends of the transistors N2 and N3 to a ground voltage.

In some example embodiments, where the memory cell MC has the first resistance RP, the voltage of the sensing node S1 may decrease while the voltage of the second output node S3 is being maintained at the reference voltage VPRE, and as a result, the voltage of the first output node S2 may decrease. The cross-coupled latch CCL may read data from the memory cell MC by amplifying the difference in voltage between the first and second output nodes S2 and S3.

However, in some example embodiments, where the memory cell MC has the second resistance RAP, the voltage of the sensing node S1 may increase while the voltage of the second output node S3 is being maintained at the reference voltage VPRE, and as a result, the voltage of the first output node S2 may increase. The cross-coupled latch CCL may read data from the memory cell MC by amplifying the difference in voltage between the first and second output nodes S2 and S3.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

While embodiments are described above, it is not intended that these embodiments describe all possible forms of the inventive concept of the present disclosure. Rather, the words used in the specification are words of description rather than limitation, and it is understood that various changes may be made without departing from the spirit and scope of the inventive concept of the present disclosure.

Additionally, the features of various implementing embodiments may be combined to form further embodiments of the present disclosure.

What is claimed is:

1. A writing method of a magnetic junction memory device which writes data to first and second magnetic junction memory cells using a global write driver and first and second local write drivers, the writing method comprising:
   receiving, by the global write driver, a first write command and first write data from a host;
   storing the first write data in a first write latch of the first local write driver in response to the first write command while the global write driver is receiving a second write command and second write data from the host,
   writing, by the first local write driver, the first write data to the first magnetic junction memory cell in response to the first write command while the global write driver is receiving the second write command and the second write data from the host; and
   writing, by the first local write driver, the first write data to the first magnetic junction memory cell in response to the first write command while the second local write driver is storing the second write data in second write latch of the second local write driver and writing the second write data to the second magnetic junction memory cell in response to the second write command.

2. The writing method of claim 1, further comprising:
   receiving, by the global write driver, a third write command and third write data from the host while the second local write driver is writing the second write data to the second magnetic junction memory cell in response to the second write command.

3. The writing method of claim 1, wherein the writing, by the first local write driver, the first write data to the first magnetic junction memory cell in response to the first write command, comprises receiving the first write data from the global write driver via a global data line, storing the first write data, and writing the stored first write data to the first magnetic junction memory cell via a local data line, which is separate from the global data line.

4. The writing method of claim 1, wherein
   the magnetic junction memory device further includes a third local write driver and a third magnetic junction memory cell, and
   the writing method further comprises receiving, by the global write driver, a third write command and third write data while the second local write driver is writing the second write data to the second magnetic junction memory cell in response to the second write command, and writing, by the second local write driver, the second write data to the second magnetic junction memory cell while the third local write driver is writing the third write data to the third magnetic junction memory cell in response to the third write command.

5. The writing method of claim 1, wherein
   the first magnetic junction memory cell is disposed in a first memory bank,
   the second magnetic junction memory cell is disposed in a second memory bank, and
   the first local write driver is disposed between the first and second memory banks.

6. The writing method of claim 1, wherein the host is external to the memory device.

7. A magnetic junction memory device comprising:
- a first memory bank including a plurality of first magnetic junction memory cells;
- a first local write driver adjacent to the first memory bank and connected to first and second global data lines, the first local write driver configured to write data to the plurality of first magnetic junction memory cells via first and second local data lines;
- a second memory bank adjacent to the first memory bank and including a plurality of second magnetic junction memory cells;
- a second local write driver adjacent to the second memory bank and connected to the first and second global data lines, the second local write driver configured to write data to the plurality of second magnetic junction memory cells via third and fourth local data lines, the third and fourth local data lines not connected to the first and second local data lines;
- a global write driver configured to provide first write data to the first local write driver via the first and second global data lines and provide second write data to the second local write driver via the first and second global data lines;
- a column decoder connected to the first memory bank and the second memory bank; and
- a sensing circuit configured to read data from the first memory bank and the second memory bank, wherein during a first write period, the global write driver is configured to receive the second write data from a host and the first local write driver is configured to receive the first write data from the global write driver and write the first write data to the plurality of first magnetic junction memory cells, during a second write period, which follows the first write period, the global write driver is configured to receive a third write data from the host and the second local write driver is configured to receive the second write data from the global write driver and write the second write data to the plurality of second magnetic junction memory cells, the first memory bank includes a first sub-memory cell array which include the plurality of first magnetic junction memory cells, the second memory bank includes a second sub-memory cell array which includes the plurality of second magnetic junction memory cells, which does not share wordlines with the first sub-memory cell array, the first local write driver is between the first and second sub-mirror cell arrays, the first local write driver includes a first write latch configured to store the first write data to be written to the plurality of first magnetic junction memory cells, and the second local write driver includes a second write latch configured to store the cells and which is separate from the first write latch.

8. The magnetic junction memory device of claim 7, wherein during the second write period, the first local write driver is configured to write the first write data to the plurality of first magnetic junction memory cells.

9. The magnetic junction memory device of claim 8, further comprising:
- a third memory bank adjacent to the second memory bank and including a plurality of third magnetic junction memory cells; and
- a third local write driver adjacent to the third memory bank and connected to the first and second global data lines, the third local write driver configured to write data to the plurality of third magnetic junction memory cells via fifth and sixth local data lines, the fifth and sixth local data lines not connected to the first, second, third and fourth local data lines, wherein during a third write period, which follows the second write period, the global write driver is configured to receive a fourth write data from the host and the third local write driver is configured to receive the third write data from the global write driver and write the third write data to the plurality of third magnetic junction memory cells.

10. The magnetic junction memory device of claim 9, wherein during the third write period, the second local write driver is configured to write the second write data to the plurality of second magnetic junction memory cells.

11. The magnetic junction memory device of claim 7, further comprising:
- a first sub-memory cell array selection element configured to connect the first global data line and the first local data line based on a bank selection control signal, and configured to connect the second global data line and the second local data line based on a bank selection control signal; and
- a second sub-memory cell array selection element configured to connect the first global data line and the third local data line based on a bank selection control signal and configured to connect the second global data line and the fourth local data line based on the bank selection control signal.

12. The magnetic junction memory device of claim 7, further comprising:
- a first bitline multiplexer configured to select the first and second local data lines; and
- a second bitline multiplexer configured to select the third and fourth local data lines.

13. The magnetic junction memory device of claim 7, wherein the first local data line is connected to first ends of each of the plurality of first magnetic junction memory cells, and the second local data line is connected to second ends of each of the plurality of first magnetic junction memory cells.

14. The magnetic junction memory device of claim 13, wherein the first global data line includes a global source line, the second global data line includes a global bitline, the first and third local data lines include first and third local source lines which are connected to the global source line, and the second and fourth local data lines include second and fourth local bitlines which are connected to the global bitline.

15. A magnetic junction memory device comprising:
- a global write driver configured to
- receive a first write command from a host for a first memory bank, which includes a plurality of first magnetic junction memory cells, during a first write period, receive a second write command from the host for a second memory bank, which includes a plurality of second magnetic junction memory cells, during a second write period, the second write period following the first write period and receive a third write command from the host for a third memory bank, which includes a plurality of third magnetic junction memory cells, during a third write period, the third write period following the second write period;

a first local write driver configured to receive the first write command from the global write driver and perform a first write operation on the plurality of first magnetic junction memory cells during the second write period;

a second local write driver configured to receive the second write command from the global write driver and perform a second write operation on the plurality of second magnetic junction memory cells during the third write period;

a column decoder connected to the first memory bank and the second memory bank;

a sensing circuit configured to read data from the first memory bank and the second memory bank;

a first write latch configured to receive first write data from the global write driver during the second write period; and a second write latch configured to receive second write data from the global write driver during the third write period, wherein the second write latch is separate from the first write latch, wherein during the third write period, the first local write driver is configured to perform the first write operation on the plurality of first magnetic junction memory cells based on the first write command.

16. The magnetic junction memory device of claim 15, further comprising:

a third local write driver, wherein the global write driver is configured to receive a third write command for a third memory bank, which includes a plurality of third magnetic junction memory cells, during a fourth write period, which follows the third write period, the third local write driver is configured to receive the third write command from the global write driver and perform a third write operation on the plurality of third magnetic junction memory cells, and during the fourth write period, the second local write driver is configured to perform the second write operation on the plurality of second magnetic junction memory cells based on the second write command.

17. The magnetic junction memory device of claim 16, wherein during the third write period, the global write driver is configured to receive the third write command.

18. The magnetic junction memory device of claim 16, further comprising:

a fourth local write driver, wherein the global write driver is configured to receive a fourth write command for a fourth memory bank, which includes a plurality of fourth magnetic junction memory cells, during a fifth write period, which follows the fourth write period, the fourth local write driver is configured to receive the fourth write command from the global write driver and perform a fourth write operation on the plurality of fourth magnetic junction memory cells, and during the fifth write period, the third local write driver is configured to perform the third write operation on the plurality of third magnetic junction memory cells based on the third write command.

* * * * *